United States Patent [19]

Rimpo et al.

[11] Patent Number: 5,392,252
[45] Date of Patent: Feb. 21, 1995

[54] PROGRAMMABLE MEMORY ADDRESSING

[75] Inventors: Charles R. Rimpo, Mesa; Walter H. Potts, Tempe; Joe A. Thomsen, Chandler; Mitch A. Stones, Phoenix, all of Ariz.

[73] Assignee: VLSI Technology, Inc., San Jose, Calif.

[21] Appl. No.: 612,293

[22] Filed: Nov. 13, 1990

[51] Int. Cl.[6] .............................................. G11C 8/00
[52] U.S. Cl. ............................ 365/230.02; 365/230.01
[58] Field of Search ....................... 365/189.02, 230.01, 365/230.02, 230.03, 230.04

[56] References Cited

U.S. PATENT DOCUMENTS

| | | | |
|---|---|---|---|
| 4,601,018 | 7/1986 | Baun et al. | 365/189 |
| 4,675,808 | 6/1987 | Grinn et al. | 365/230.03 |
| 4,800,535 | 1/1989 | McAlpine | 365/230.03 |
| 4,809,234 | 2/1989 | Kuwashiro | 365/230.03 |
| 4,881,206 | 11/1989 | Kadono | 365/230.03 |
| 4,899,272 | 2/1990 | Fung et al. | 365/230.03 |
| 5,005,157 | 4/1991 | Catlin | 365/230.02 |

Primary Examiner—Eugene R. LaRoche
Assistant Examiner—Vu A. Le
Attorney, Agent, or Firm—LaValle D. Ptak

[57] ABSTRACT

A software programmable memory addressing system operates with multiple banks of DRAM chips. The DRAM chips in the different banks may be of different sizes and may be located physically in arrangements where the largest memory chips are not necessarily placed in the first memory bank. The system permits 256K, 1M, and 4M DRAMs to be supported separately, and in combinations of any two of the three types. An internal DRAM controller generates row address strobes (RAS) and column address strobes (CAS) which are supplied to a multiplexer switch bank for routing the RAS and CAS strobes to the physical DRAM banks according to a program set in a register used to control the operation of the multiplexers. Consequently, internally generated logical RAS and CAS signals are routed to the appropriate physical banks of DRAM to create a valid memory map, without requiring the physical arrangement of the banks of DRAMs in a pre-established order.

7 Claims, 2 Drawing Sheets

DRAM MEMORY MAPS SUPPORTED

| BANK0 | BANK1 | BANK2 | BANK3 | MEMORY MB | RAMMAP(4-0) |
|---|---|---|---|---|---|
| 256K | | | | 0.5 | 0 |
| 256K | 256K | | | (1.38)1.0 | (1F*)1 |
| 256K | 256K | 256K | | 1.5 | 2 |
| 256K | 256K | 256K | 256K | 2.0 | 3 |
| 1M | | | | (2.38)2.0 | (1E*)4 |
| 256K | 1M | | | 2.5 | 5 |
| 256K | 256K | 1M | | 3.0 | 6 |
| 1M | 1M | | | 4.0 | 7 |
| 1M | 1M | 256K | | 4.5 | 8 |
| 256K | 256K | 1M | 1M | 5.0 | 9 |
| 1M | 1M | 1M | | 6.0 | A |
| 1M | 1M | 1M | 1M | 8.0 | B |
| 4M | | | | 8.0 | C |
| 256K | 4M | | | 8.5 | D |
| 256K | 256K | 4M | | 9.0 | E |
| 1M | 4M | | | 10.0 | F |
| 1M | 1M | 4M | | 12.0 | 10 |
| 4M | 4M | | | 16.0 | 11 |
| 256K | 256K | 4M | 4M | 16.5 | 12 |
| 1M | 4M | 4M | | 17.0 | 13 |
| 1M | 1M | 4M | 4M | 18.0 | 14 |
| 4M | 4M | 4M | | 20.0 | 15 |
| 1M | 4M | 4M | 4M | 24.0 | 16 |
| 4M | 4M | 4M | 4M | 32.0 | 17 |

FIG. 3

REMAP CONFIGURATION REGISTER CODE

| RAMMOV CODE | | | | DRAM BANK MAPPING (LOGICAL → PHYSICAL DRAM BANKS) | | | |
|---|---|---|---|---|---|---|---|
| D3 | D2 | D1 | D0 | 3 | 2 | 1 | 0 |
| 0 | 0 | 0 | 0 | 3 | 2 | 1 | 0 |
| 0 | 0 | 0 | 1 | 3 | 2 | – | 0 |
| 0 | 0 | 1 | 0 | 3 | 0 | 2 | 1 |
| 0 | 0 | 1 | 1 | 3 | – | 2 | 0 |
| 0 | 1 | 0 | 0 | 3 | 0 | – | 2 |
| 0 | 1 | 0 | 1 | 3 | – | 0 | 2 |
| 0 | 1 | 1 | 0 | 2 | 3 | 1 | 0 |
| 0 | 1 | 1 | 1 | 2 | – | 1 | 0 |
| 1 | 0 | 0 | 0 | – | 3 | 2 | 0 |
| 1 | 0 | 0 | 1 | – | 2 | 3 | 0 |
| 1 | 0 | 1 | 0 | 0 | 3 | 2 | – |
| 1 | 0 | 1 | 1 | 0 | 2 | 3 | – |
| 1 | 1 | 0 | 0 | 0 | – | 3 | 1 |
| 1 | 1 | 0 | 1 | 0 | – | 1 | 3 |
| 1 | 1 | 1 | 0 | 0 | 1 | 3 | 2 |
| 1 | 1 | 1 | 1 | 0 | 1 | 2 | 3 |

FIG. 4

PROGRAMMABLE MEMORY ADDRESSING

BACKGROUND OF THE INVENTION

Modern digital computers, particularly personal computers, currently are designed to accommodate memory chips of different sizes, and of different numbers. The memory chips are inserted on circuit boards in physical locations known as memory banks. The memory chips currently used are dynamic random access memory (DRAM) chips, and a memory bank is defined as the grouping of DRAM chips containing the number of data bits required to support the full width of the data bus of the central processing unit (CPU), plus one parity bit for each byte (8 bits). For computers such as the IBM AT ®, this translates to an 18 bit bank width. For computers using the Intel ® 386 CPU, a 36 bit bank width is required. In order to designate the amount of memory which has been inserted into the computer, computers generally have a plurality of switches which are manually set, or an electronic sensing circuit is used to detect how much memory has been inserted into the computer.

Existing computers require the memory chips (DRAMS) to be inserted in sequential sections because the computer system determines how much memory the system has installed in it by checking the memory up to the point where no chips are found at a particular location. Currently, DRAMS are available in different sizes and configurations, namely 256K, 1 Meg., and 4 Meg. sizes. For most existing digital computers and personal computers, it is necessary to insert different size DRAMS into the memory banks in a particular physical order or arrangement.

Each memory bank also can accommodate only one size of DRAMS. For a typical initial installation, this is not a problem, since the computer is initialized or set up with a specific default assignment by means of programmable switches or the like, to designate the type of and amount of memory in the computer. In addition, the physical arrangement of the DRAM chips, where chips of different memory size are used, initially is typically effected in the physical order or arrangement which the computer is designed to accommodate.

Because of the requirements for utilizing switches to indicate the size and location of the DRAMS in associated memory banks, prior art systems of the type described above are relatively costly and inflexible. A particular problem arises when additional DRAM chips are added to the computer after an initial installation, or whenever there is a failure or partial failure of DRAM chips in a memory bank already installed in the system. The physical removal and relocation of previously existing DRAM chips generally is required when new DRAM chips of different sizes from those previously installed are to be plugged into the DRAM sockets. Consequently, it is necessary to have an understanding of the physical requirements of the system in order to properly install a memory for operation within the system. A similar situation exists when there is a failure of a DRAM chip or a portion of a DRAM chip in a location other than the highest or last location of the memory. Such a failure has the effect of changing the amount of memory available and, frequently, renders operation of the system with the remaining DRAM chips impossible until there is an actual, physical relocation of the remaining DRAM chips in the system.

A system employing two programmable registers for controlling each bank of DRAM chips has been designed for overcoming the limitations of the prior art devices discussed above. In this system, two programmable registers are used to control each bank of DRAM chips. One register specifies the type of DRAM (that is, the size ) populating that memory bank. The second programmable register specifies the starting address at which the memory bank is accessed. Such a system permits arrangement of the physical DRAM banks in other than a pure sequential order; so that greater flexibility in the physical installation of the DRAM chips is permitted. This system, however, still has some disadvantages. For example, since a starting address must be programmed for each DRAM bank, the DRAM banks can be programmed in such a manner that the address ranges overlap. This can cause system errors. In addition, the control of this system is embedded in the memory controller; so that the logic involved is complex, and reduces the timing margin in critical paths of the system. It is necessary to provide logic to compare each address to the stored internal address in a programmable register. A decision then is made as to which control strobes must be generated in order to drive the proper DRAM bank. This logic comparison adds additional delay to the system operation, in addition to increasing the system complexity.

Accordingly, it is desirable to provide a programmable memory addressing system for a computer memory which overcomes the disadvantages of the prior art systems mentioned above, which prevents overlap of memory space, and which also generates sequential addressing to the DRAM chips in the memory with memory chips of different sizes being physically insertable into any of the memory banks.

SUMMARY OF THE INVENTION

It is an object of this invention to provide an improved memory addressing system for a computer memory.

It is an additional object of this invention to provide an improved memory addressing system for memory devices of different sizes.

It is an additional object of this invention to provide a flexible programmable memory addressing system for DRAM chips in a computer system.

It is a further object of this invention to provide a programmable control mechanism for addressing and controlling multiple sizes of DRAMS arranged logically in an order which is different from the physical arrangement of the DRAM chips in the memory banks.

In a preferred embodiment of the invention, DRAM memory devices may be plugged into any physical location in the memory banks of the computer. Firmware, in the form of a software programmable register, provides the system with the ability to logically reorder the physical memory banks in conjunction with a memory map control register to achieve valid memory maps for operating the system.

BRIEF DESCRIPTION OF THE DRAWINGS

FIG. 3 is a table of memory maps supported by the system of FIG. 1; and

FIG. 4 is a table showing the remap configuration register codes used to operate the system in the manner illustrated in FIG. 2.

DETAILED DESCRIPTION

Figure 1:
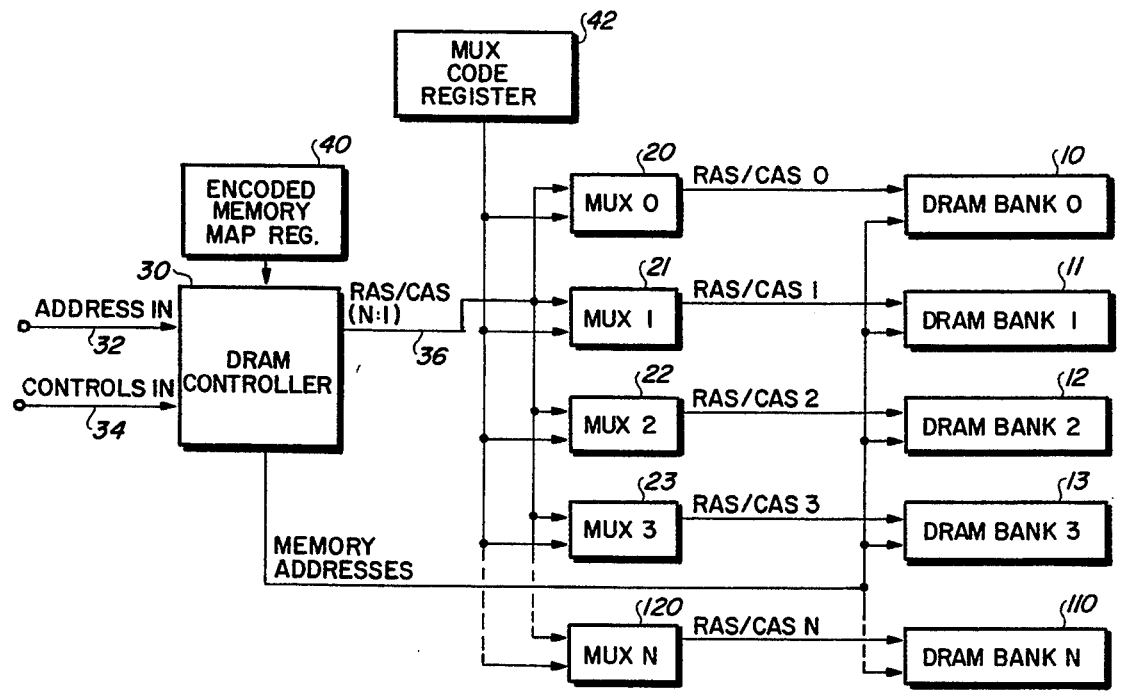
FIG. 1 is a block diagram of a preferred embodiment of the invention.

Reference now should be made to the drawings which illustrate a preferred embodiment of the invention. In FIG. 1, a typical arrangement of DRAM memory banks, 10 through 13, and 110, corresponding to physical DRAM banks 0 through 3 and is illustrated. The number of memory banks which may exist in any given computer varies, and can extend beyond four or more memory banks. Each of these memory banks is provided with a memory address from a DRAM controller 30, and with row address strobe (RAS) and column address strobe (CAS) signals corresponding to the row and column information of the memory chips placed in each of the DRAM memory banks 10 through 13 and 110. When the DRAM memory chips, located in the DRAM banks 10 through 13 and 110, are physically located in accordance with a memory map physically set by operating switches or by software in the system, the RAS/CAS signals and memory address signals are applied directly to the DRAM banks from the DRAM controller 30.

The system of FIG. 1, however, is constructed to greatly increase the number of possible memory maps (logical DRAM chip arrangements) without increasing the decode logic, or significantly reducing the DRAM memory timing margins. This is accomplished by causing the RAS and CAS strobe signals generated by the internal DRAM controller 30 to be switched from the external pins normally associated with their default assignments, to any one of the other external RAS and CAS pins on the DRAM banks 10 through 13 and 110. This is accomplished by positioning fast CMOS multiplexer circuits 20 through 23 and 120 between the DRAM controller logic 30 and the RAS and CAS output pins of the DRAM banks 10 through 13 and 110, respectively.

A software programmable multiplex code register 42 is used to store a code (RAMMOV) which controls the operation of the multiplexers 20 through 23 and 120. This code, in conjunction with a normal memory map control register 40, connected to the DRAM controller 30, provides multiple ways to configure the DRAM memory subsystem in order to achieve valid memory maps.

The logical DRAM banks configured by the encoded memory map register 40 and the operating sequence of the multiplex circuits 20 through 23 and 120, differ from the actual physical locations of the memory chips in the DRAM banks 10 through 13 and 110, to permit operation of the system as if the physical location of the DRAM memory chips in the DRAM banks 10 through 13 and 110 strictly followed the order shown in FIG. 3. Such actual physical arrangement no longer is necessary with the system disclosed in FIG. 1. Address and control signals are applied over leads 32 and 34 to the DRAM controller 30, which then routes the addressing of the physical DRAM banks 10 through 13 and 110 in accordance with the logical DRAM banks stablished by the encoded memory map register 40 and the operation of the multiplex circuits 20 through 23 and 120.

The physical memory banks 10 through 13 and 110, are designed to accommodate either 256K DRAMS, 1M DRAMS, or 4M DRAMS, or even 16M DRAMS, when they become available, in any of the DRAM banks 10 through 13 and 110. For a computer system having an 18 bit data bus (16 bits and 2 parity bits) the bus can accommodate two bytes of data (a byte of data is 8 bits) and two parity bits. Consequently, each of the DRAM banks 10 through 13 and 110, can have any one of:

a) 18 256K×1 or 4 256K×4 and 2 256K×1 DRAMS (0.5 Megabyte of memory);
b) 18 1M×1 or 4 1M×4 and 2 1M×1 DRAMS, 2 Megabytes of memory;
c) 18 4M×1 or 4 4M×4 and 2 4M×1 DRAMS, 8 Megabytes of memory.

In a standard system, the starting address for the first bank 10 is always 0. When the DRAM chips are inserted with the largest chips in the first DRAM bank, and with the successive DRAM banks having the same size or the next smaller size DRAM memory chips, problems associated with multiple banks of memory chips do not arise.

As explained above, however, the embodiment of the invention shown in FIG. 1 is designed to operate with multiple banks of memory, in which the DRAM chips in any of the banks need not be arranged physically in the same arrangement as the logical arrangement of the memory banks. The table shown in FIG. 3 is illustrative of 24 memory maps which are supported by the system shown in FIG. 1. This table shows some of the various DRAM combinations which are addressable in each of four 16-bit memory banks corresponding to the DRAM banks 10 through 13 of FIG. 1. The memory column shows the total system memory available for each memory map. The RAMMAP (4-0) column indicates the hexadecimal value written in bits 4-0 of the RAMMAP indexed configuration register in order to select each map. It is to be noted that banks 0 through 3 in this table, refer to the "logical" banks as internally addressed by the system. The actual system board memory banks accessed by the internal signals, may differ, depending on the values stored in the indexed configuration register of FIG. 4.

Figure 2:
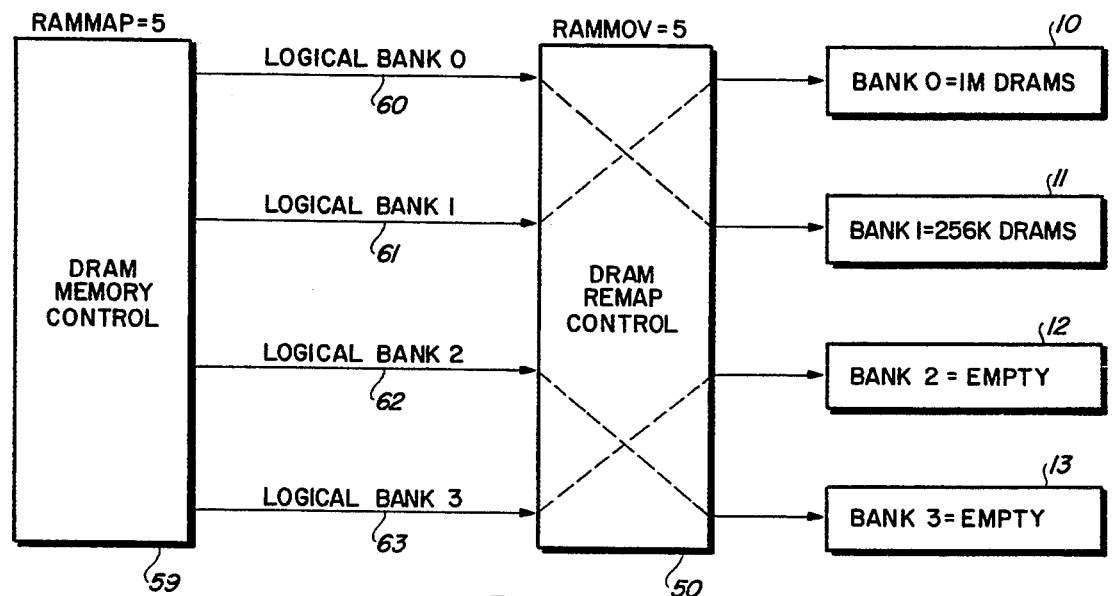
FIG. 2 is a representative Logic diagram of the operation of the system shown in FIG. 1.

The operation of the system now will be considered in conjunction with FIGS. 2 and 4 for four DRAM banks, such as banks 10 to 13. Reference first should be made to the remap or RAMMOV configuration register codes of FIG. 4 for operating the multiplex switching circuits 20 through 23. This code is applied to the circuits 20 to 23 by the multiplex code register 42 to accommodate different physical arrangements of the actual DRAM chips, by mapping the logical DRAM bank configurations in different ways into the four physical DRAM banks corresponding to DRAM banks 10 through 13. Obviously, the system can be expanded to accommodate any number of DRAM banks greater than the four DRAM banks with which FIGS. 2 and 4 are concerned.

For four DRAM banks, such as the banks 10 through 13, the use of the RAMMOV function of FIG. 4 provides sixteen different ways to remap the logical maps of the various combinations of four DRAM banks of FIG. 3 into the four physical DRAM banks 0 through 3, (DRAM banks 10 through 13 of FIG. 1). The combination of these two register functions, namely the encoded memory map register 40 and the multiplex code register 42, corresponding to the tables of FIGS. 3 and 4, respectively, provides a large number of unique ways to create a valid memory map without the necessity of physically re-locating the DRAM chips in the different DRAM banks 10 through 13 and 110. The remap configuration code of FIG. 4 supports all of the twenty-four memory maps of FIG. 3 and is capable of supporting even more memory maps than are shown in FIG. 3, if desired.

By way of example, reference should be made to FIG. 2. The physical DRAM banks need not be populated in the same order as would normally be dictated by the RAMMAP options alone. One example of when this is useful is the case where a system with one bank of 1M DRAMS, located in bank 10 (physical DRAM bank 0), is upgraded by adding a second bank of 256K DRAMS. Without the RAMMOV feature provided by the multiplex code register 42, and the multiplex switching circuits 20 through 23 and 120, it would be necessary to remove the 1M DRAM bank and move it to bank 11 (physical DRAM bank 1), and then place the 256K DRAMS in physical DRAM bank 0. Using the RAMMOV function provided by the multiplex code register 42, and the multiplex circuits, allows the 1M DRAMS to be left in place in DRAM bank 10 (physical bank 0). The 256K DRAMS then may be placed in any of the other three DRAM banks, 11, 12, or 13 (corresponding to physical banks 1, 2, and 3). The proper RAMMOV code then is programmed by the multiplex code register 42; so that the logical memory map for this configuration is correctly routed to the proper physical DRAM devices.

For the example under consideration, this is illustrated by showing the logical banks 0, 1, 2, and 3 as interconnected from the DRAM memory control 59 on the leads 60, 61, 62 and 63, respectively, to the DRAM remap control circuit function 50. The necessary interconnections to properly address the physical DRAM banks 10, 11, 12, and 13 to cause the system to properly address the DRAM memory chips, located in these physical banks, is indicated by the dotted line interconnections within the DRAM remap control circuit 50, as illustrated. This is accomplished by the multiplex circuits of FIG. 1, where the multiplex circuit 21 interconnects the logical bank 0 RAS/CAS and address signals to the DRAM bank 11, and the multiplex circuit 20 causes the logical bank 1 signals to be interconnected with the inputs to the DRAM bank 10 (physical bank 0), as diagrammatically illustrated in FIG. 2. The re-map control for accomplishing this corresponds to the RAMMOV code 0100, as it appears in FIG. 4. As shown in FIG. 4, of the RAMMOV code for 0100 causes the DRAM bank mapping to place the logical DRAM banks 2,3,0,1 into the physical DRAM bank positions corresponding, respectively, to physical positions 3, 2, 1, 0. This is shown in the re-map configuration register code table of FIG. 4. Other logical DRAM bank configurations and their interconnections with the actual physical DRAM bank locations are illustrated in FIG. 4, for sixteen different RAMMOV code configurations.

It should be noted that when the RAMMOV code illustrated in FIG. 4 is "0000," the default condition exists, and the logical DRAM banks and physical DRAM banks are directly interconnected, and have the same physical bank numbers in the same sequence. This is apparent by comparing the logical DRAM bank configuration for this code to the actual physical DRAM bank locations, as illustrated in the table of FIG. 4.

It should be noted that once the physical locations of the DRAM chips are established in the physical DRAM banks 10 through 13 and 110, the appropriate multiplex RAMMOV code is entered, either by means of physical switches or by means of a software programming, into the multiplex code register 42 for operating the multiplex circuits 20 through 23 and 120. Similarly, the corresponding encoded memory map is supplied to the DRAM controller 30 from the encoded memory map register 40 in accordance with the table shown in FIG. 3. This information then causes the logical memory bank information to be properly routed to the actual physical DRAM banks to operate the system in the same manner as if the DRAM memory chips of different sizes had been physically relocated into the proper sequence within the DRAM banks 10 through 13 and 110 for which the computer system originally was designed. Consequently, valid memory maps are produced for proper operating of the system. The utilization of software coded registers 42 and 40 is particularly useful when there is a failure of a memory in any one of the physical DRAM banks. This information then can be supplied back to the multiplex code registers 42 and encoded map register 40, to provide a different re-map control for permitting operation of the system until such time as the defective DRAM memory chip or chips can be replaced.

As is readily apparent, the preferred embodiment of the invention which has been described above, covers any case which allows internally generated DRAM control signals, which would normally be hard-wired to an output pin on a given device, to be switched to alternate output pins under programmable control. The foregoing description of the preferred embodiment of the invention should be considered as illustrative of the invention and not as limiting. Various changes and modifications will occur to those skilled in the art without departing from the true scope of the invention as defined in the appended claims.

We claim:

1. A memory addressing system for a computer memory having a plurality of memory banks of memory devices of different sizes, which may be arranged physically in said memory banks in any desired order, said addressing system including in combination:

means for supplying a plurality of different row and column address signals to said memory banks;

memory map means pre-encoded with a memory map corresponding to the physical arrangement of said memory devices and coupled with said row and column address signal supply means for supplying at least row and column address signals corresponding to logical memory bank outputs;

switching control means comprising a plurality of multiplexers each connected to a different one of said plurality of memory banks for interconnecting said logical memory bank outputs with selected ones of said memory banks to create a valid programmable memory map irrespective of the actual locations of memory devices of different sizes in said memory banks; and a multiplex code register coupled with said multiplexers for routing said logical memory bank outputs through said multiplexers to said memory banks as determined by said multiplex code register.

2. The combination according to claim 1 wherein said memory devices comprise combinations of any two of 256K chips, 1M chips and 4M chips.

3. The process according to claim 2 wherein said memory devices are DRAMS.

4. The process according to claim 1 wherein said memory devices are DRAMS.

5. A process of addressing a memory system having a plurality of memory banks of memory devices of different sizes comprising the steps of:

providing N memory banks in predetermined physical locations in which memory devices of different sizes may be located in any of said N memory banks;

establishing a memory map for supplying address signals corresponding to logical memory bank outputs;

providing a multiplex switch interface between said logical memory bank outputs and said memory banks; and programming said multiplex switch means to re-route any one of said logical memory bank outputs to any selected one of said N memory banks in accordance with a pre-established re-routing code.

6. The process according to claim 5 further comprising the step of encoding the operation of said multiplex switch means in accordance with the sizes of the memory devices stored in each of said N memory banks.

7. The process according to claim 6 wherein said memory devices are DRAMS.

* * * * *